(12) United States Patent
Wattyn et al.

(10) Patent No.: US 12,353,135 B2
(45) Date of Patent: Jul. 8, 2025

(54) APPARATUS AND METHOD FOR GENERATING A RELIEF CARRIER BY IRRADIATION

(71) Applicant: XSYS Prepress N.V., Ypres (BE)

(72) Inventors: Bart Wattyn, Dentergem (BE); Eva Freudenthaler, Korntal-Munchingen (DE); Martin Kunz, Waldbronn (DE)

(73) Assignee: XSYS Prepress N.V., Ypres (BE)

( * ) Notice: Subject to any disclaimer, the term of this patent is extended or adjusted under 35 U.S.C. 154(b) by 535 days.

(21) Appl. No.: 17/413,012

(22) PCT Filed: Jan. 13, 2020

(86) PCT No.: PCT/EP2020/050712
§ 371 (c)(1),
(2) Date: Jun. 11, 2021

(87) PCT Pub. No.: WO2020/148234
PCT Pub. Date: Jul. 23, 2020

(65) Prior Publication Data
US 2022/0066325 A1 Mar. 3, 2022

(30) Foreign Application Priority Data
Jan. 14, 2019 (NL) ..................................... 2022394

(51) Int. Cl.
*G03F 7/20* (2006.01)
*B29C 64/124* (2017.01)
(Continued)

(52) U.S. Cl.
CPC .......... *G03F 7/2012* (2013.01); *B29C 64/124* (2017.08); *B29C 64/236* (2017.08);
(Continued)

(58) Field of Classification Search
CPC ............... G03F 7/2012; B29C 45/1756; B29C 45/1742; B29C 64/40; B29C 64/241;
(Continued)

(56) References Cited

U.S. PATENT DOCUMENTS 10,589,507 B2 * 3/2020 El-Siblani ............. B29C 64/241
10,589,512 B2 * 3/2020 DeSimone ............. B33Y 30/00
(Continued)

FOREIGN PATENT DOCUMENTS

DE 10159084 A1 6/2003
DE 102016006621 A1 11/2017
(Continued)

OTHER PUBLICATIONS

P. de Beer, Martin ("Rapid, continuous additive manufacturing by volumetric polymerization inhibition patterning." Science advances vol. 5,1 eaau8723. Jan. 11, 2019, doi:10.1126/sciadv.aau8723) (Year: 2019).*

(Continued)

*Primary Examiner* — Michael A Tolin
*Assistant Examiner* — Hana C Page
(74) *Attorney, Agent, or Firm* — KDW Firm PLLC

(57) ABSTRACT

An apparatus for generating a relief carrier using a solidifiable material includes a support structure configured for providing a substantially cylindrical support surface. The support surface may be formed by a substrate intended to be part of the relief carrier to be generated or by a cylindrical support not intended to be part of the relief carrier to be generated. A container is provided for the solidifiable material, the container having a wall arranged substantially parallel to an axis of the support structure; a moving means to move the support structure relative to the wall such that subsequent areas of the support surface face the wall during the moving. Moving includes at least a rotation around the (Continued)

axis. An irradiating means sends irradiation, through the wall in a predetermined area between the support surface and the wall.

13 Claims, 6 Drawing Sheets

(51) Int. Cl.
| | |
|---|---|
| *B29C 64/236* | (2017.01) |
| *B29C 64/241* | (2017.01) |
| *B29C 64/245* | (2017.01) |
| *B29C 64/268* | (2017.01) |
| *B29C 64/277* | (2017.01) |
| *B33Y 10/00* | (2015.01) |
| *B33Y 30/00* | (2015.01) |
| *B33Y 80/00* | (2015.01) |

(52) U.S. Cl.
CPC .......... *B29C 64/241* (2017.08); *B29C 64/245* (2017.08); *B29C 64/268* (2017.08); *B29C 64/277* (2017.08); *B33Y 10/00* (2014.12); *B33Y 30/00* (2014.12); *B33Y 80/00* (2014.12)

(58) Field of Classification Search
CPC .. B41C 1/003; B41C 1/10; B41C 1/05; B41C 1/1066; B41C 1/1075; B41C 1/18; B41J 3/407; B41J 3/40733
See application file for complete search history.

(56) References Cited

U.S. PATENT DOCUMENTS

| | | | |
|---|---|---|---|
| 2017/0136688 A1* | 5/2017 | Knecht | ................. B29C 64/245 |
| 2018/0355221 A1* | 12/2018 | Franke | .................... B05D 5/10 |

FOREIGN PATENT DOCUMENTS

| | | | | |
|---|---|---|---|---|
| EP | 0467100 | * | 1/1992 | ........... B29C 64/135 |
| WO | 2010079017 A2 | | 7/2010 | |
| WO | 2012022636 A1 | | 2/2012 | |
| WO | 2018026597 A1 | | 2/2018 | |
| WO | 2018208799 A1 | | 11/2018 | |

OTHER PUBLICATIONS

International Search Report and Written Opinion for PCT/EP2020/050712, mailed Apr. 16, 2020.

* cited by examiner

APPARATUS AND METHOD FOR GENERATING A RELIEF CARRIER BY IRRADIATION

This is a national stage application filed under 35 U.S.C. § 371 of pending international application PCT/EP2020/050712, filed Jan. 13, 2020, which claims priority to Netherlands Patent Application No. 2022394, filed Jan. 14, 2019, the entirety of which applications are hereby incorporated by reference herein.

FIELD OF INVENTION

The field of the invention relates to apparatuses and methods for generating a relief carrier, such as a relief plate or sleeve, more in particular s a printing plate or printing sleeve, using a solidifiable material. Particular embodiments relate to the field of generating an image relief plate or sleeve for printing.

BACKGROUND

Flexographic printing or letterpress printing are a techniques which are commonly used for high volume printing. Flexographic or letterpress printing plates are relief plates with image elements protruding above non-image elements in order to generate an image on a recording medium such as paper, cardboard, films, foils, laminates, etc. Flexographic or letterpress printing plates are typically sufficiently flexible to be wrapped around a printing cylinder. Also, cylindrically shaped printing plates or sleeves may be used.

Various methods exist for making flexographic printing plates. According to conventional methods flexographic printing plates are made from multilayer substrates comprising a backing layer and one or more photocurable layers. Those photocurable layers are imaged by exposure to electromagnetic radiation through a mask layer containing the image information or by direct and selective exposure to light e.g. by scanning of the plate to transfer the image information in order to obtain a relief plate.

According to another known method, printing plates are made using an additive manufacturing or 3D printing production method. In such methods, the construction of the layers may be carried out layer per layer by solidifying material e.g. by photocurable polymer resin using UV light radiation or by melt deposition. The successive layers may be formed on the top side of a growing layer structure in an additive manner. Other improved methods use a continuous liquid interface printing method. Such a continuous process uses a reservoir of solidifiable material with a bottom which is transparent for radiation capable of solidifying the solidifiable material. A carrier substrate, which is the substrate on which the relief structure is to be built, is initially in direct contact with the solidifiable material. Subsequently the substrate is moved away from the bottom of the reservoir after polymerization occurred and fresh liquid material fills the gap. The formation of solidified material on the surface of the substrate is a continuous process and the solidified material is in constant contact with the solidifiable material in the reservoir until the formation of the printing plate is complete. Such continuous liquid interface printing methods can avoid problems with cleavage lines which occur for stepwise methods. Also, the time needed to produce a printing plate can be reduced compared to conventional methods. However, when using such methods, the solidified material may stick to the bottom wall of the container which may lead to destruction of the structures formed. Also, the feeding of fresh solidifiable material into the gap formed between the growing substrate and the bottom wall may be slow and difficult, especially when the solidifiable material is too viscous. This limits the achievable speed of the production process and the quality of the resulting printing plates.

In addition most of the additive processes are performed in a planar configuration. In printing applications, plates carrying the relief have to be mounted on printing cylinders, which imposes mechanical stress on the relief surface due to bending. This mechanical stress can result lower mechanical stability and hence in shorter print length.

SUMMARY

The object of embodiments of the invention is to provide an apparatus and method for generating a relief carrier using a solidifiable material, which is faster and more reliable than the known apparatuses and methods. More in particular, it is desirable to be able to generate relief carriers or structures, especially printing plates or printing sleeves in a faster and more reliable manner using a solidifiable material. Furthermore, it is desirable to provide a method and apparatus which work well for viscous solidifiable materials.

According to a first aspect of the invention there is provided an apparatus for generating a relief carrier using a solidifiable material. The apparatus comprises a support structure, a container, a moving means and an irradiating means. The support structure is configured for providing a substantially cylindrical support surface, wherein the support surface may be formed by a substrate intended to be part of the relief carrier to be generated or by a cylindrical support not intended to be part of the relief carrier to be generated. In other words, the support structure may be a support structure intended to be used with a substrate or may be a support structure intended to be used without a substrate arranged thereon or may be a support structure which can be used either with or without a substrate. The container is configured for receiving the solidifiable material. The container has a wall arranged substantially parallel to an axis of the support structure, such that the support surface is at a determined distance of the wall. The moving means is configured to move the support structure relative to the wall, such that subsequent areas of the support surface face the wall during the moving. The moving comprises at least a rotation around the axis (A) of the support structure. The support structure is moved relative to the wall, implying that either the support structure is moved, or the wall is moved, or both the support structure and the wall are moved. The irradiating means is configured to send irradiation through said wall, in a predetermined area between the support structure and the wall to solidify the solidifiable material at the support surface. The wall is configured to allow said irradiation to pass through the wall.

By providing a cylindrical support surface, i.e. either a cylindrical surface of a substrate arranged on the support structure or a cylindrical surface of the support structure itself, solidifiable material in the container can reach the predetermined area to be irradiated more easily compared to known solutions where the substrate is arranged on a plate. Indeed, as the support structure rotates around its axis, solidified material is moved away from the predetermined area to be irradiated, and fresh solidifiable material can flow towards the predetermined area from an immediately adjacent area where plenty of solidifiable material is present because of the cylindrical shape. Also, because of the rotation of the support structure, fresh material adhering to the surface upstream of the predetermined area may be pulled into the predetermined area. In that manner, even for viscous materials, fresh material is brought easily into the predetermined area to be irradiated. The speed of that flow is not limiting the speed of the moving means, and hence the solidifiable material that is being used may be more viscous than in the prior art, whilst still achieving a good result.

The support structure may be substantially cylindrical or the support structure may be configured for receiving a cylindrical carrier, such as a hollow cylinder or sleeve. The substrate may be e.g. a flat flexible plate or sheet or film arranged around the support structure or a cylindrical sleeve or sleeve section. When a cylindrical carrier such as a cylindrical sleeve is used, the support structure may be cylindrical but does not need to be cylindrical.

According to an exemplary embodiment, the moving means is configured to allow the support surface to be provided with solidified material over substantially 360°. Typically, this will imply one or more rotations of the support structure around its axis over 10° to 360°. Even though the device is typically able to be rotated over 360°, the rotation may also be conducted over less degrees from 10° to 360°, preferably from 45° to 360°, more preferably from 90° to 360°, most preferably form 180° to 360° and most of the time from 270° to 360°. The rotation may start at one end of the container but it is also possible to start a partial rotation at any point of the container. In that manner, one or more layers may be formed across the entire support surface or across a portion thereof.

In a preferred embodiment, the support surface describes a full cylinder. For example, in an embodiment where a substrate is used the substrate may be a sleeve-like substrate, forming a full cylinder. In a preferred embodiment, the support structure comprises a drum on which a flexible substrate can be fixed. Alternatively, the drum may be used with a substrate. In other embodiments, the support structure may comprise two cones configured to be inserted in opposite ends of a sleeve-like substrate such that the cylindrical substrate is clamped and can be rotated.

According to an exemplary embodiment, the moving means is configured to move the axis of the support structure parallel to the wall of the container, whilst rotating the support structure around the axis. In that manner, the support surface can be more or less "rolled" over fresh solidifiable material as a layer of solidified material is being formed on the support surface. Seen at the predetermined area where the irradiating is taking place, the rotation direction of the support structure is preferably opposite to the movement direction of the support structure relative to the wall of the container. In other words, the support structure is translated relative to the wall of the container in a direction away from the side of the support structure on which the layer is being formed.

According to a further developed embodiment, the moving means is configured to translate and rotate the support structure relative to the wall, such that for each degree of rotation of the support structure, the support structure is translated relative to the wall over a distance which is within 20% of a value calculated as $\pi$ multiplied with the outer diameter d of the support surface divided by 360 ($\pi*d/360$), preferably within 10% of said value. In other words, the movement performed by the support structure is as if the support surface rolls over a virtual surface. In that manner, any disturbance or stirring of the solidifiable material in the container is limited, the force to remove solidified material from the wall is low due to a limited adhesion area, and detachment occurs in a gentle and gradual fashion resulting in a neatly formed solidified layer on support surface. It is noted that the translation speed may be adjusted in function of the thickness of the substrate (when a substrate is used) and/or in function of the number of layers formed on the support surface, in order to compensate for the increased diameter.

According to an exemplary embodiment, the moving means is configured to translate the support structure and/or to translate the container. More in particular, the support structure may be translated parallel to the wall of the container, and/or the container may be translated such that the wall moves parallel to the axis of the support structure. An advantage of translating the support structure is that the apparatus may be more compact. An advantage of translating the container, is that both the support structure and the irradiating means may remain fixed. However, it is also possible to couple the support structure and the irradiating means, and to move those together relative to the container. In such an embodiment, the apparatus may comprise irradiating moving means configured to move an irradiating area of the irradiating means with respect to the wall in synchronization with the support structure. The irradiating means may also be moved parallel to the wall of the container. In addition, the movement of the irradiating area of the irradiating means may be performed by moving an irradiating area generated by a light source e.g. by means of moving mirrors, activation of selected LEDs of a LED array or a moving beam or a combination thereof.

According to a preferred embodiment, the apparatus further comprises adjustment means configured to change the distance between the wall and the support structure. In that manner, after a first layer of solidified material has been grown on the support surface or on a previous layer, the distance between the wall and the support structure may be changed, such that a new gap is formed between the surface of the last layer and the wall. Thereupon a second layer may be grown on the first layer. Repetition of these steps allows growing a relief structure with multiple layers.

According to an exemplary embodiment, the apparatus further comprises a controller configured to control the moving means and the irradiating means such that subsequent adjacent longitudinal zones of the support surface are irradiated. These longitudinal zones extend parallel to the axis of the support structure. For example, the irradiating means may be configured to irradiate a longitudinal zone having a width between 0,1 and 20 mm. Depending on the type of irradiating means that is being used, this may correspond to 1 to 2000 lines of irradiating elements. For example, one line of elements could consist of a line of LEDs, or 20 to 100 laser lines can form the irradiation area. It is noted that this is merely an example, and that other widths and a different number of lines may also be used in embodiments of the invention.

Preferably, the moving of the support structure (translation and/or rotation) as well as the irradiating means is a more or less continuous process in the sense that the support structure is continuously moved while the irradiating means are continuously and selectively irradiating. However, it is also possible to provide a controller configured to control the moving means and the irradiating means such that movement and irradiation are performed in steps. The segments or areas of these steps may partially overlap or be adjacent to each other.

In a typical embodiment, the controller is configured to control the moving means, the adjustment means and the irradiating means, such that one or multiple layers of solidified material are formed on the support surface. Preferably at least one layer of said one or multiple layers covers more than 90°, more preferably 180°, most preferably substantially 360°. In other words, preferably the one or multiple layers are formed on a large portion of the support surface.

More preferably, the controller is configured to control the moving means, the adjustment means and the irradiating means, such that, during on or more rotations, for example over 360°, of the support structure, at least one full layer of solidified material is formed on the support surface to form a floor, and during one or more subsequent rotations, for example over 360°, at least one image layer of structured solidified material is formed on the floor. In other words, by forming one or multiple layers on the support surface, a relief structure can be formed. Such a method allows producing relief structures at improved speeds, with a good image quality. When working without a substrate, a floor will be formed first. However, when working with a substrate it is also possible to omit the floor.

According to a preferred embodiment, the controller is configured to control the movement means, the adjustment means and the irradiating means such that during one or more rotations over up to 360° of the support structure at least one structured layer of solidified material is formed. By repetition of this movement, a three-dimensional relief is achieved.

According to a preferred embodiment, the moving means is configured to translate the support structure relative to the wall in a forward direction from an initial position to an end position, whilst the support structure is being rotated, and next, in a backward direction from the end position back to the initial position. It is also possible to move the support structure farther away from the wall of the container and move it backward with or without rotation and repeat the formation of the next layer in forward direction. During the movement in the backward direction, the irradiation may be stopped or may continue. If the irradiation is continued whilst moving the support structure in the backward direction, then the support structure is also rotated when it is being moved in the backward direction. By irradiating both when the support structure is moved in the forward direction and in the backward direction, further time savings can be achieved. In case that structures shall be built in a partial area of the support surface the rotation and exposure may be limited to those areas while during rotation without exposure the rotation speed may be increased and the light source may be switched off in order to save time and/or energy.

According to an exemplary embodiment, the wall is a bottom wall of the container, preferably a flat bottom wall. Such a container is simple and robust, and allows for a good alignment with the axis of the support structure. However, it is also possible to provide a container with a curved wall, e.g. a bottom wall portion with a cylindrical section arranged parallel to the axis of the support structure. In a possible embodiment, the bottom wall of the container has an upwardly curved cylindrical section which faces a downwardly curved cylindrical section of the support structure, wherein an axis of this support structure is parallel to an axis of the cylindrical section of the bottom wall. By using such opposite cylindrical sections (see also the embodiment of FIG. 3), fresh solidifiable material can easily flow towards the area to be irradiated. The irradiating means are preferably located centrally below the cylindrical bottom wall section, such that the area with the smallest gap between the support structure and the bottom wall is irradiated. According to another possible embodiment, the container may be formed as a cylinder or partial cylinder having an axis which is parallel to the axis of the support structure, wherein the axes of the container and the support structure are located at a distance of each other and wherein the diameter of the cylindrical container is larger than the diameter of the completely built structure (support structure with optional substrate plus built layers). Using a closed cylinder can be advantageous to keep the system free of dust and avoid evaporation of volatile material from the container. A container formed as an open or partial cylinder makes loading of the optional substrate and unloading of the generated relief carrier easier. The irradiating means is arranged to irradiate an area between the support structure and the container, where the gap is smallest (see also the embodiment of FIG. 4). In order to limit any disturbance of the solidifiable material in the container, both the support structure and the container may be rotated in the same direction, e.g. at more or less the same speed. Also in such embodiments, the solidified material on the support surface can gradually be removed from the bottom wall of the container, whilst fresh solidifiable material flows towards the area to be irradiated. In this setup the amount of solidifiable material in the container may be significantly reduced.

In a possible embodiment, the wall is provided on a surface inside the container with an anti-stick layer configured to limit sticking to solidified material. This will further improve the loosening of the solidified layer from the wall of the container, as the support structure is moved. Such layers or are preferably films or coatings with low surface energy e.g. fluor or silicon containing materials, like Teflon or silicones or organo-silicones.

In another embodiment, the wall and/or parts of the wall are transparent to electromagnetic radiation and/or inhibitors. Transparence to electromagnetic radiation is a key property of the wall and is typically above 50%, preferably above 60%, more preferably above 70%, most preferably above 80% in the wavelength range used for irradiation. The electromagnetic waves may be e.g. any one of the following: broadband electromagnetic waves, narrow band electromagnetic waves, monochromatic electromagnetic waves, large area electromagnetic waves e.g. with a lamp, selective electromagnetic waves, e.g. emitted by a laser, waves emitted along the full axial length of the drum or along a portion of the axial length of the drum, continuous or pulsed electromagnetic waves, high or low energy electromagnetic waves, UV to IR electromagnetic waves. The wavelength of the electromagnetic waves may be in the range from 200 to 20000 nm, preferably in the range of 250 to 15000 nm, more preferably in the range of 300 to 11000 nm, most preferably in the range of 350 to 11000 nm. The total power of the electromagnetic radiation may range from low values which are enough to trigger a chemical reaction to high values causing fast heating of material, e.g. in the range form 0,1 mW to 2000 W, preferably from 1 mW to 1000 W, more preferably from 5 mW to 7500 W, most preferably from 1 W to 200 W.

Transparency for inhibitors can be achieved by layers or membranes, which allow inhibitors for the solidifying reaction to diffuse through them and to prevent the solidification in close proximity of the wall surface. In this way, adhesion to the wall is prevented and forces are reduced during lifting of the solidified material. One of the most commonly used solidification reactions is radical polymerization and/or crosslinking which is inhibited by oxygen. Hence layers with high diffusion coefficients for oxygen or porous layers can be used to reduce forces during loosening of the solidified layer from the wall of the container. Such layers with high oxygen diffusion coefficient are for example silicones, fluorinated polymers, LD-PE, natural and artificial rubbers.

In a preferred embodiment, the irradiating means comprises one or more irradiating elements arranged in one or more lines parallel to the axis of the cylinder. Typically, ten or more lines may be provided. The irradiating means may comprise any one of the following or a combination thereof: a UV irradiating means (e.g. a plurality of UV LEDs), a LED array, an infrared irradiating means, a laser means, a scanning means, a projection means, a liquid crystal display, an active matrix (O)LED display. A projection means may comprise e.g. a plurality of digital micro mirrors projecting radiation beams onto the support surface. If a liquid crystal display is used, one line after another line of the liquid crystal display may be switched on while the support structure is moving. More generally, there may be provided irradiating means which are capable of only irradiating a small elongated zone, or there may be provided irradiating means capable of irradiating a wide zone covering the distance over which the support structure is being moved (e.g. a liquid crystal display). In the latter case, the irradiating means will not need to be moved.

It is preferred that the irradiating means is capable of being controlled in a way that the intensity of small increments of the linear irradiated area can be changed or switched off in order to transfer the image information. There are a number of ways to achieve this and they largely depend on the irradiating means employed. In case of an LED array the intensity of single LEDs may be controlled or switched off. In case of a display-like light source, single pixels may be controlled or switched off. In case of a projection system employing movable micro mirrors the mirrors may be controlled to irradiate selected areas only. In case of a scanning laser beam, the laser may be controlled or switched off. It is also clear that the controller which controls the movement means and the adjustment means may also control the irradiation means not only in terms of movement and speed, but also in terms of intensity, beam shape and/or diameter and location of irradiation.

Preferably, the determined distance between the support surface and the wall is smaller than 1 cm. More preferably, the support surface and the wall are shaped such that a gap is formed which, as seen in the movement direction, narrows toward the predetermined irradiated area. Preferably, the predetermined irradiated area is such that the solidified material extends from the support surface to the wall in order to get a neat layer.

According to a second aspect of the invention, there is provided a method for generating a relief carrier using a solidifiable material, more preferably for generating a printing plate or a printing sleeve. The method comprises:

providing a substantially cylindrical support surface, wherein the support surface may be formed by a substrate intended to be part of the relief carrier to be generated or by a cylindrical support not intended to be part of the relief carrier to be generated;

arranging said substantially cylindrical support surface at least partially in a solidifiable material in a container, at a distance of a wall of the container and such that the wall is parallel to an axis of the substantially cylindrical support surface; moving said support surface relative to the wall such that subsequent areas of the support surface face the wall during the moving;

solidifying the solidifiable material by irradiation through the wall, in a predetermined area between the support surface and the wall.

Preferred embodiments of the method are disclosed in the enclosed set of claims. The technical merits set out above in connection with the apparatus apply mutatis mutandis for the method. Also, apparatus features may be combined with method features and vice versa.

According to an exemplary embodiment an additional layer may be applied/laminated on the formed structured solidified material. By application of an additional layer, on top of the formed relief structure, devices may be created that comprise isolated and/or connected channels and spaces. The additional layer may be stiff enough so it does not sink into the channels formed or one may use a flexible layer and take care that it cannot sink into the channels e.g. by using a fluid or gas to fill the channels. Optionally the channels may be filled with other materials and fluids. Such devices may be used as microfluidic device, (e.g. for microanalytics or for high throughput screenings), as microreactors, as optical devices (e.g. as phoretic cell as described in WO2004/015491), as light controlling element (e.g. as described e.g. in WO2003/062900) or as photonic crystals. The additional layer may be applied in a post treatment step. The devices described above may be designed in a stiff or elastic fashion. Flexible devices are preferred especially when they are used at and/or in a human body, and/or in fabrics and/or in clothes.

In preferred embodiments, the solidifiable material is a viscous photosensitive coating material. The viscosity according to DIN 1342-2 may be higher than 400 mPa*s, more preferably higher than 500 mPa*s, even more preferable higher than 700 mPa*s, and most preferably higher than 1000 mPa*s. Examples of solidifiable materials that may be used in embodiments of the invention are viscous photosensitive compositions, which solidify or cure due to a chemical reaction, which leads to polymerization and/or crosslinking Such reactions may be radical, cationic or anionic polymerization and crosslinking. Other means for crosslinking are condensation or addition reactions e.g. formation of esters, ethers, urethanes or amides. Such composition may include initiators and/or catalysts, which are triggered by electromagnetic radiation. Such initiators or catalysts can be photo-initiator systems with one or more components that form radicals, acids or bases, which then initiate or catalyze a reaction, which leads to polymerization or crosslinking. The necessary functional groups can be attached to low molecular weight monomers, to oligomers or to polymers. In addition, the composition may comprise additional components such as binders, filler, colorants, stabilizers, tensides, inhibitors, regulators and other additives, which may or may not carry functional groups used in the solidification reaction. Depending on the components used, flexible and/or rigid materials can be obtained after the solidification and post treatment is finished.

The method is not limited to the use of one solidifiable material. By changing the solidifiable material in the container or exchanging the container with at least another containing a different solidifiable material it is possible to create layers made of different materials. In this way, multilayer reliefs with at least two different materials can be obtained. The layers may differ in color, their mechanical, chemical or physical properties.

In embodiments of the invention where a substrate is used, the substrate may be e.g. a flat flexible plate or sheet or film or a cylindrical sleeve or sleeve section. Suitable sleeves may comprise, for example, layers of polyester, polyacrylate, polyurethane or epoxy resin, the layers being customarily reinforced with woven or non-woven fibers or fiber mats. The fibers may be selected form polymer fibers (made of polyester, polyamide, polyaramid, polyimide, polyethylene, polypropylene), glass fibers or carbon fibers. Preferably, glass fibers are used. Suitable dimensionally stable support layers, e.g. flexible plates, films or sheets, typically have a thickness of 50 to 1000 micrometer. The material of the support layer may comprise, for example plastics such as, for example, polyesters such as polyethylene terephthalate, polybutylene terephthalate, polyethylene naphthalate, polyurethanes or polycarbonates. Especially suitable are PET films having a thickness of 100 to 200 micrometer.

Preferably, the predetermined area where the solidifiable material is solidified, is delimited by the support surface and the wall, in order to obtain a neat delineation of the solidified layer.

According to another aspect, the invention relates to the use of the relief carriers or structures, preferably manufactured according to any one of the embodiments disclosed above, as flexographic printing plate or sleeve, letterpress plate or sleeve, tampon printing plate or sleeve, intaglio printing plate or sleeve, microfluidic device, micro reactor, phoretic cell, photonic crystal and optical device.

According to another aspect of the invention there is provided a relief carrier having a base layer and a relief layer. The relief layer is formed as a stepped profile of solidified material, wherein the height of a step of the stepped profile is smaller than 0.5 millimeter, preferably smaller than 300 micrometer.

Such a relief carrier has the advantage that the relief areas are provided in a stable manner, being narrower at the top than at the bottom. Also, by using steps, a precise and well aligned relief structure can be obtained.

The overall height or thickness of the relief layer built may be in the range of 0,1 µm up to 10000 µm, preferably in the range of 1 µm to 7000 µm, more preferably in the range of 100 µm to 5000 µm and most preferably in the range of 100 µm to 3000 µm.

Preferably, the stepped profile comprises a plurality of relief areas, wherein at least one relief area has an upper landing and at least one flight of steps between the base layer and the upper landing. When the relief carrier is used for printing purposes, the upper landings may define accurately an image to be printed, whilst the steps can guarantee sufficient stability and flexibility of the relief areas during printing. The upper landing may have a curved surface, as the relief layer may be build by forming a plurality of cylindrical layers on a cylindrical support surface, as has been described above in connection with embodiments of the method and the apparatus.

By application and solidification of the layers which create the steps, in a curved form, the surface layers of the relief carrier are not mechanically stressed when mounted in a cylindrical manner, as on the support structure. This is an additional advantage over relief structures of the prior art, which are manufactured in a planar manner and next bent for mounting on a cylinder, e.g. for printing purposes.

According to an exemplary embodiment, the upper landing is substantially surrounded by the at least one flight of steps. This will further enhance the stability of the relief areas. However, in other embodiments it may be sufficient to provide flights of steps at certain edges of the upper landing, and not at all edges of the upper landing. In some cases, it may be sufficient to have steps at only one side or not at all sides of the landing. For example, steps may be provided parallel to edges extending in the axial direction of the support structure, whilst not providing steps at edges perpendicular to the axial direction of the support structure. The steps may be used to mechanically stabilize the relief structure in one or several directions in which a stabilization is required by the later application.

Preferably, each flight of steps comprises at least two steps, preferably at least three steps, more preferably at least five steps. It is noted that each step may comprise one or more layers of solidified material, i.e. each step may be grown through one or more passes of the irradiating means. The step dimensions and/or shapes of adjacent steps of a flight of steps may be the same or different. Optionally, when the relief carrier is intended to be used for printing, the step dimensions and/or shapes may be determined based on the image to be printed.

The width of the steps may be the same for all steps or it may vary in a way that the width of the steps close to the substrate is larger than the width of the steps close to the landing or the other way around. The width of the steps from bottom to top or from top to bottom may change in a linear, polynomial, logarithmic or exponential fashion. The width of the steps may be in the range of 1µ to 5000 µm, preferably in the range of 10 µm to 3000 µm, more preferably in the range of 10 µm to 1000 µm, most preferably in the range of 10 µm to 500 µm.

According to an exemplary embodiment, the relief carrier is a relief sleeve with a cylindrical base layer. However, in other embodiments the relief carrier may be a relief cylinder segment or a flexible relief plate. Preferably the stepped profile is provided over more than 20°, preferably over more than 90°, more preferably over more than 180°, even more preferably over more than 270°, and most preferably over substantially 360° of the outer surface of the relief carrier. In that manner the carrier can be optimally used. When the relief carrier is used for printing, the skilled person understands that the relief areas, and hence the stepped profile will depend on the image to be printed, and that certain areas of the relief carrier corresponding with non-printing areas, may be void of any relief structures.

Preferably, the relief carrier has a maximum thickness which is smaller than 20 mm, preferably smaller than 10 mm, more preferably smaller than 7 mm. In that manner the relief carrier can be sufficiently stable whilst not being too rigid.

The overall height or thickness of the relief layer built on the base layer may be in the range of 0,1 µm up to 10000 µm, preferably in the range of 1 µm to 7000 µm, more preferably in the range of 100 µm to 5000 µm and most preferably in the range of 100 µm to 3000 µm.

Preferably, a step of the stepped profile is delimited by a riser wall oriented within 20° from a radial direction, preferably within 10° from a radial direction of a cylindrical support surface on which the relief areas have been formed. Even more preferably, a step of the stepped profile is delimited by a wall oriented substantially radially. It is noted that the relief carrier may be cylindrically shaped, and in that case the radial direction corresponds with a radial direction of the cylinder shape. Alternatively, the relief carrier is a flexible plate which is mounted on a cylindrical surface, and the radial direction then corresponds with a radial direction of the cylindrical surface.

According to a yet another aspect of the invention, there is provided a method for generating a relief carrier using a solidifiable material, more preferably for generating a printing plate or a printing sleeve, based on image data. The method comprises:

providing a substantially cylindrical support surface, wherein the support surface may be formed by a substrate intended to be part of the relief carrier to be generated or by a cylindrical support not intended to be part of the relief carrier to be generated;

determining a stepped structure comprising a plurality of relief areas based on the image data;

applying a plurality of layers of a solidifiable material on the substantially cylindrical support surface in order to obtain the stepped structure on said support surface.

Preferably the stepped structure is determined such that at least one relief area has an upper landing and at least one flight of steps between a base layer and the upper landing. The base layer may correspond to the substrate and/or one or more layers of solidified material. When a substrate is used, the one or more layers of solidified material are optional. When no substrate is used the base layer may be formed by one or more layers of solidified material.

The preferred features set out below for the relief carrier with a stepped profile may also be present in the determined stepped structure. More in particular, based on the image data, the number and/or dimensions and/or shape of the steps of the relief areas may be determined.

Further, any method steps defined above in connection with embodiments of the method may be used in the method according to the last aspect.

BRIEF DESCRIPTION OF THE FIGURES

The accompanying drawings are used to illustrate presently preferred non-limiting exemplary embodiments of devices of the present invention. The above and other advantages of the features and objects of the invention will become more apparent and the invention will be better understood from the following detailed description when read in conjunction with the accompanying drawings, in which.

DESCRIPTION OF EMBODIMENTS

Figure 1A:
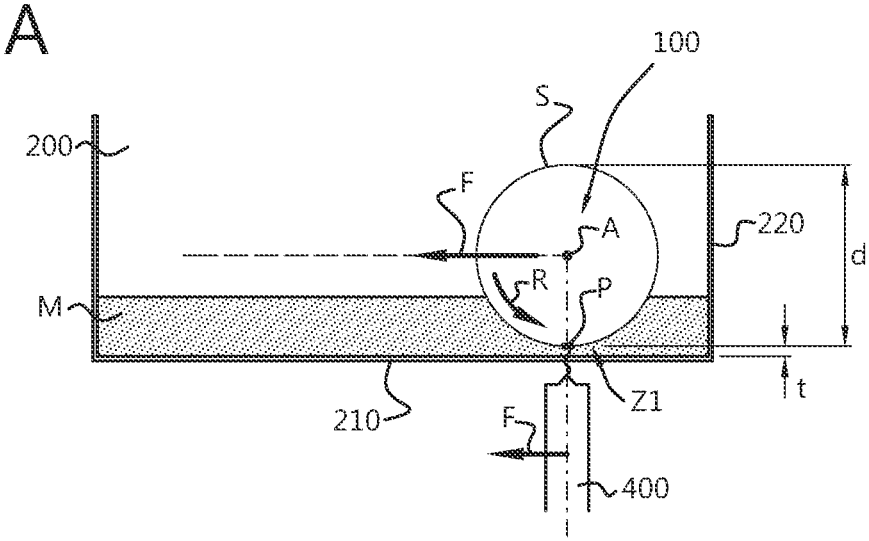
FIGS. 1A, 1B and 1C illustrate a first exemplary embodiment of a method in which the container is fixed, whilst the support structure and irradiating means are being moved.

FIG. 1A illustrates schematically an apparatus for arranging a solidifiable material M on a cylindrical support surface S. The apparatus comprises a support structure in the form of a drum 100 on which a substrate may be fixed. In another embodiment the cylindrical drum 100 itself forms a support surface on which the relief carrier is built, without the use of a substrate. The apparatus further comprises a container 200 containing solidifiable material M, a moving means (not shown) configured to move the drum 100 parallel to a bottom wall 210 of the container 200, an adjustment means (not shown) configured to adjust the distance t between the drum 100 and the bottom wall 210, and an irradiating means 400. The container 200 has a bottom wall 210 and a side wall 220. The bottom wall 210 is arranged parallel to an axis A of the drum 100. The drum 100 is arranged in the container such that the support surface S is at a determined distance t of the bottom wall 210. The irradiating means 400 is configured to send irradiation through the bottom wall 210 in a predetermined area between the drum 100 and the bottom wall 210 to solidify the solidifiable material in that area such that it adheres to the support surface S in that area. The bottom wall 210 is configured to allow the irradiation to pass through the bottom wall 210. It is noted that the adjustment means (not shown) to adjust the distance t may be configured to move the container 200 in a vertical direction and/or to move the drum 100 in a vertical direction. If the container 200 is moved, the irradiating means may have to be adjusted as well.

In the figure description below, when referring to a support surface S, this may be a surface of a flat substrate or a sleeve arranged on the drum 100, or this may be a surface of the drum 100 itself. In yet another embodiment, support structure is not a drum and does not have a cylindrical support surface, but is a suitable mounting system for a cylindrical substrate. For example, the mounting system may comprise two cones.

Figure 1B:
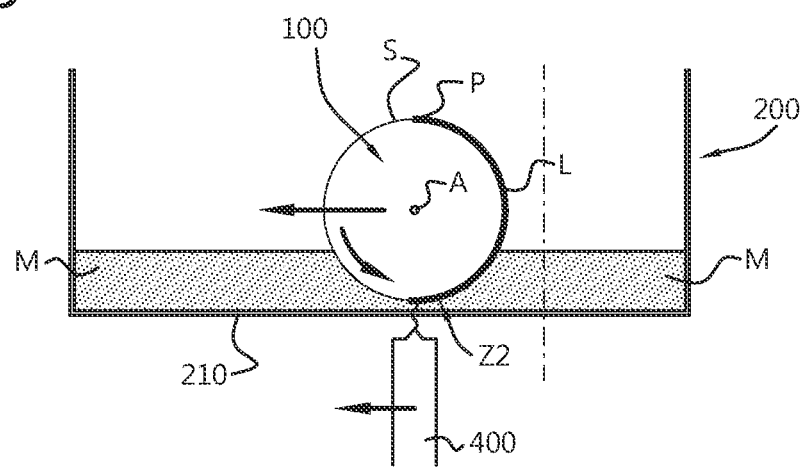
Figure 1C:
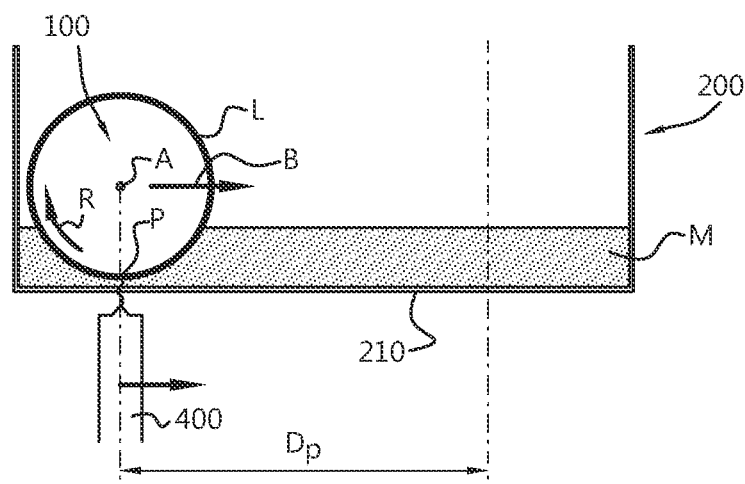

The moving means (not shown) is configured to translate the drum 100 in a forward direction F parallel to the bottom wall 210, and to rotate the drum 100 around its axis A in a rotation direction R. FIG. 1A shows the drum 100 in an initial position on the right side of the container 200. FIG. 1B illustrates an intermediate position more or less in the middle of the container 200. Point P on the support surface S which is being irradiated in the initial position of FIG. 1A is located on top of the drum 100 in the position of FIG. 1B. FIG. 1B further illustrates that a layer L of solidified material has been formed on the support surface S over substantially 180°. The drum 100 is further rotated and translated in the forwarded direction F towards the left side of the container 200, see FIG. 1C. The position shown in FIG. 1C corresponds with the end position of the drum 100. In this position a full layer L of solidified material has been formed on the support surface S and may extend over a large portion of the support surface, e.g. over substantially 360°. Now a second layer may be formed on the full layer L on the support surface S by moving the drum 100 in a backward direction B whilst rotating the drum 100 in an opposite rotation direction R. In the embodiment of FIGS. 1A-1C the irradiating means 400 is translated synchronously with the drum 100. However, it is also possible to provide an irradiating means which extends along the distance Dp between the initial position of FIG. 1A and the end position of FIG. 1C. In such an embodiment, the switching on of the lines of the irradiating means 400 may be synchronized with the translation movement of the drum 100.

In a possible embodiment, during one or more initial rotations of the support surface over 10° to 360° in the forward/backward direction F/B, at least one full layer of solidified material may be formed on the support surface S to form a floor. During one or more subsequent rotations over 10° to 360° in the forward/backward direction F/B at least one structured layer of solidified material may be formed on the floor to form a relief structure.

In a preferred embodiment, the distance Dp between the initial position and the end position is more or less equal to the circumference of the drum 100, i.e. Dp=π*d wherein d may be the outer diameter of the whole drum 100 including the substrate (if present) and any added layer(s) when present. In other words, the drum 100 is rolled over a virtual plane at a distance t of the bottom wall 210, from the initial position shown in FIG. 1A to the end position shown in FIG. 1C. Preferably, both the rotation speed of the drum 100 and the translation velocity in the forward/backward direction F/B is constant, and is such that for each degree of rotation of the drum 100 around the axis A, the axis A is translated relative to the bottom wall 210 over a distance which is within 10% of π*d/360.

The skilled person understands that instead of translating the drum 100 and the irradiating means 400 in the forward/backward direction F/B, it is also possible to translate the container 200 in the backward/forward direction B/F.

Figure 2A:
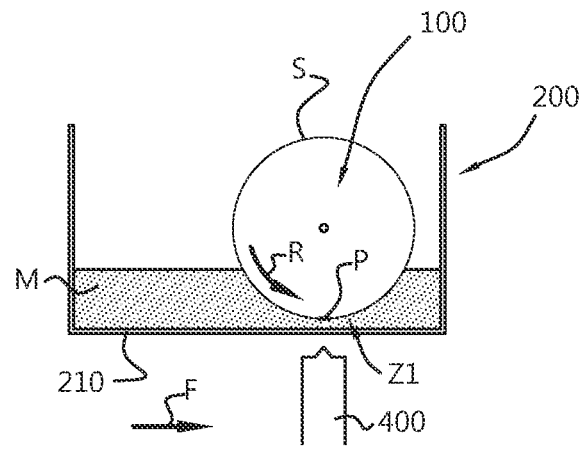
FIGS. 2A, 2B, 2C and 2D illustrate a second exemplary embodiment of a method in which the support structure is only rotated, whilst the container is being translated.
Figure 2B:
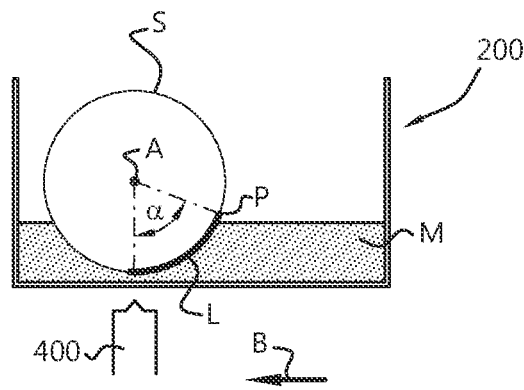
Figure 2C:
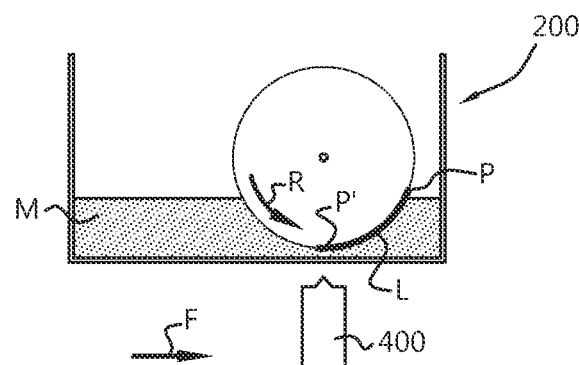
Figure 2D:
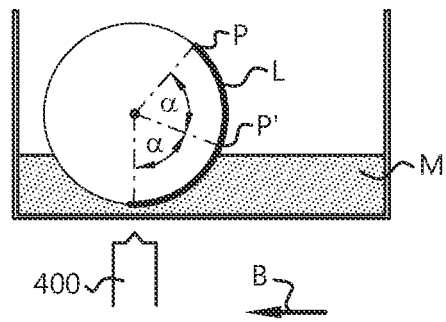

FIGS. 2A, 2B, 2C and 2D illustrate a second exemplary embodiment of an apparatus comprising a drum 100 arranged in a container 200. An irradiating means 400 sends irradiation through a bottom wall 210 of the container 200, in a similar manner as described above in connection with the embodiment of FIGS. 1A-1C. In the embodiment of FIGS. 2A-2D the container 200 is moved between an initial position shown in FIG. 2A and an end position shown in FIG. 2B. In this embodiment, the drum 100 is not rotated over 360° between the initial position and the end position, but is rotated over a smaller angle a as indicated in FIG. 2B. Note that point P has been moved from a first position in FIG. 2A to a second position in FIG. 2B over the angle a. Whilst the container 200 is being translated in the forward direction F from the initial position to the end position, the drum 100 is rotated in a rotation direction R, and the irradiating means 400 irradiate a predetermined area between the drum 100 and the bottom wall 210. In that manner, a layer L of solidified material is formed on the support surface S. This layer L extends over the angle α in the end position illustrated in FIG. 2B. Next, the container 200 is moved in the backward direction B from the end position of FIG. 2B to the initial position, see FIG. 2C. Now the container 200 is again translated in the forward direction F, whilst the drum 100 is being rotated in a rotation direction R, such that a further segment of the support surface S is covered with solidified material, see the layer L in FIG. 2D which extends over an angle equal to 2*α. In the embodiment of FIGS. 2A-2C, no irradiating is performed during the backward movement of the container 200.

The skilled person understands that instead of moving the container 200 in the embodiment of FIGS. 2A-2D, it is also possible to translate the drum 100 and the irradiating means 400 in the forward/backward direction F/B.

Figure 3:
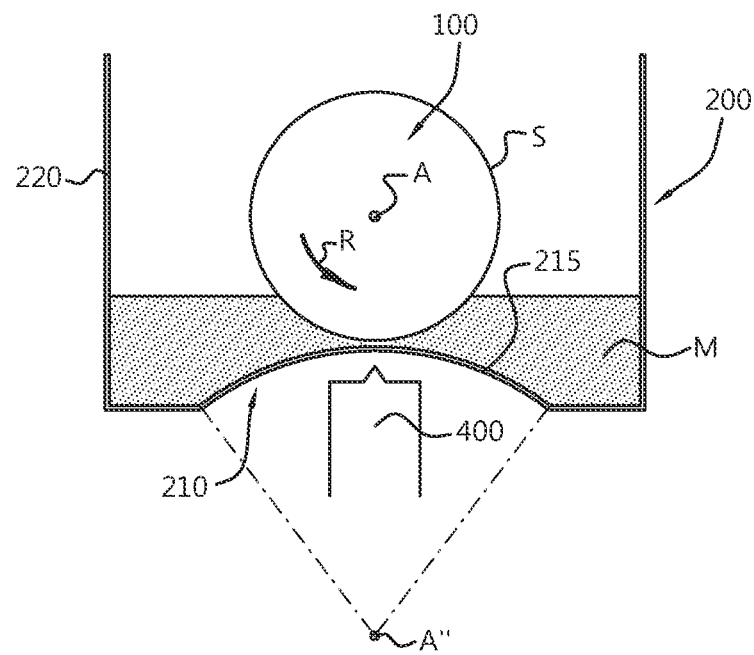
FIG. 3 illustrates a third exemplary embodiment of an apparatus for arranging a solidified material on a substrate or cylindrical carrier.
Figure 4:
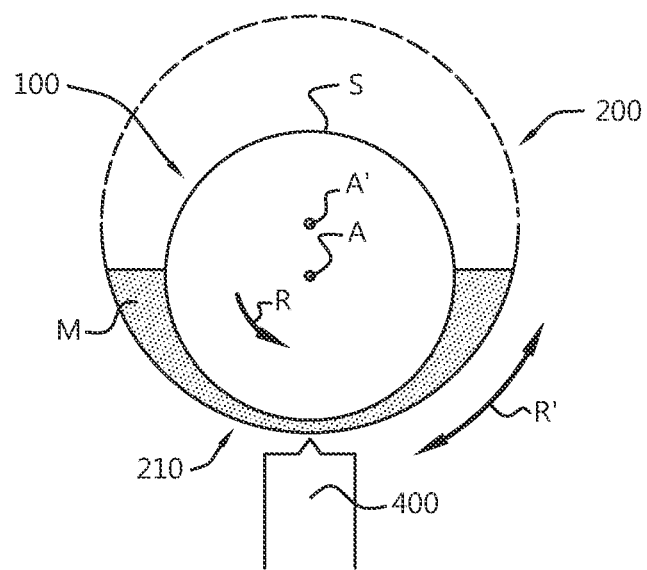
FIG. 4 illustrates a fourth exemplary embodiment of an apparatus for arranging a solidified material on a substrate or cylindrical carrier.

FIGS. 3 and 4 illustrate two further exemplary embodiments of an apparatus for arranging a solidified material on a support surface, wherein the same reference numerals refer to the same or similar components. In the embodiment of FIG. 3, the apparatus comprises a drum 100 on which a substrate may be fixed, a container 200 containing solidifiable material M, a moving means (not shown) configured to rotate the drum 100, an adjustment means (not shown) configured to adjust the distance between the drum 100 and a bottom wall 210 of the container 200, and an irradiating means 400. The container 200 has a bottom wall 210 and a side wall 220. The bottom wall 210 has an upwardly curved wall portion, here a bottom wall portion 215 with a cylindrical section arranged parallel to the axis A of the support structure, such that a gap is created between the cylindrical section 215 and the support surface S. Preferably, the irradiating means 400 are arranged to irradiate an area located between the axis A" of the cylindrical section and the axis A of the drum, where the gap is smallest. The upwardly curved cylindrical section 215 faces a downwardly curved cylindrical section of the support surface S. By using such opposite cylindrical sections 215, 100 fresh solidifiable material can easily flow towards the area to be irradiated. The irradiating means 400 are preferably located centrally below the cylindrical bottom wall section 215, such that the area with the smallest distance between the drum 100 and the bottom wall 210 is irradiated.

In the embodiment of FIG. 4, the container 200 is formed as a cylinder or partial cylinder having an axis A' which is parallel to the axis A of the support structure, here a drum 100. However, the support structure could also comprise a clamping structure to clamp a cylindrical carrier with its axis A parallel to the axis A' of the container 200. The axes A, A' of the container 200 and the drum 100 are located at a distance of each other and the diameter of the cylindrical container 200 is larger than the diameter of the completely built structure (drum 100 plus optional substrate plus built layers). The container 200 may be a closed cylinder (as indicated in dotted lines) which can be advantageous to keep the system free of dust and avoid evaporation of volatile material from the container 200. However, the container 200 may also be formed as an open or partial cylinder, which makes loading of the optional substrate and unloading of the generated relief carrier easier. The irradiating means 400 is arranged to irradiate an area between the drum 100 and the container 200, where the gap is smallest. In this setup the amount of solidifiable material in the container may be significantly reduced. Both the drum 100 and the container 200 may be rotated, see the arrows R and R'. For example, in order to limit any disturbance of the solidifiable material in the container, the drum 100 and the container 200 may be rotated in the same direction. However, for other purposes, it may also be envisaged to rotate the container 200 in the opposite direction. In yet other embodiments, the container 200 may be stationary. In yet another embodiment the drum 100 and/or the container may be stationary during the exposure while the irradiation means is moved on a cylindrical path around the container. With a set of LED arrays arranged around the container also an irradiation area may be moved by switching LEDs on and off. In a subsequent step, the drum is rotated to contact a further area of the drum with solidifiable material and subsequently exposed by moving the irradiation means.

In the embodiments of FIGS. 3 and 4, the solidified material on the support surface S can gradually be removed from the bottom wall of the container 200, whilst fresh solidifiable material flows towards the area to be irradiated.

Figure 5:
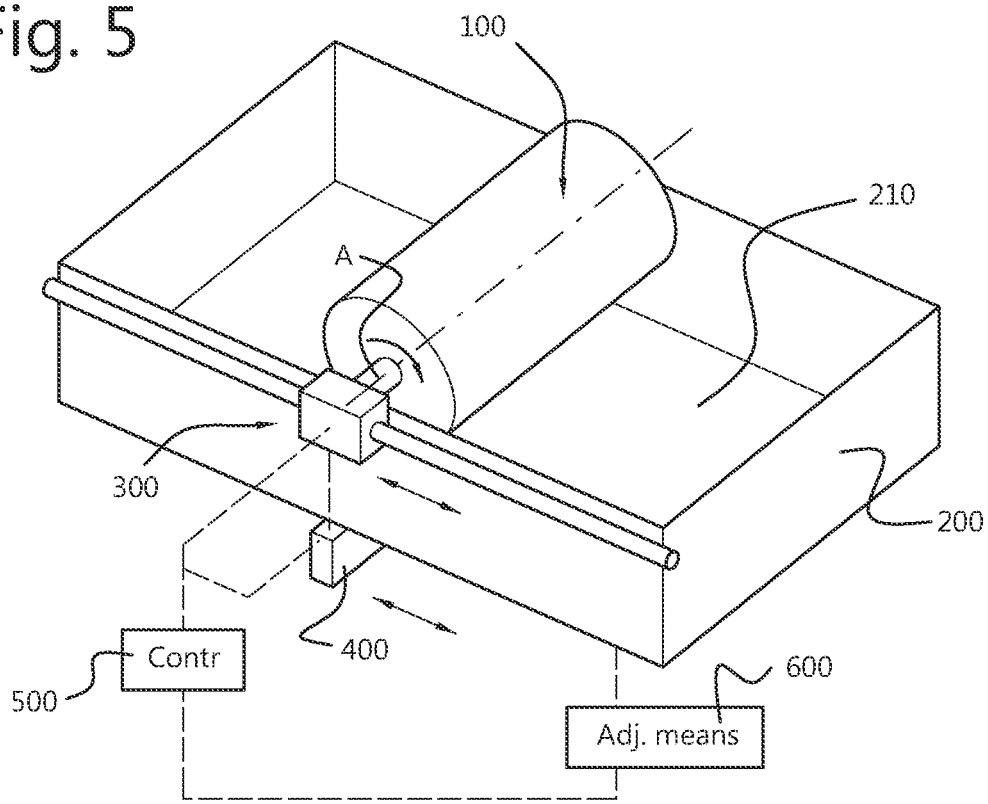
FIG. 5 illustrates a schematic perspective view of an exemplary embodiment of an apparatus for arranging a solidified material on a substrate or cylindrical carrier.

FIG. 5 illustrates schematically an apparatus for arranging a solidified material on a support surface. The apparatus comprises a container 200, a drum 100, a moving means 300, an irradiating means 400, an adjustment means 600, and a controller 500. The controller 500 is configured to control the moving means 300, the irradiating means 400 and the adjustment means 600, as indicated with dotted lines in FIG. 5. The irradiating means 400 may be coupled with the moving means 300, such that the irradiating means are moved synchronously with the translation of the axis A of the drum 100. In the embodiment illustrated in FIG. 5, the drum 100 is provided with a shaft which is arranged in bearing blocks. The moving means are configured to move the bearing blocks along a guide means which extends in a direction perpendicular on the axis A of the drum 100, and parallel to the bottom wall 210 of the container 200. The adjustment means 600 is configured to adjust a distance between the drum 100 and a bottom wall 210 of the container 200. The adjustment means may be configured to move the axis A of the drum 100 vertically and/or to move the container 200. If the container 200 is moved vertically, this may be coupled with an adjustment of the irradiating means 400 so that the irradiating area is adjusted accordingly.

Figure 6:
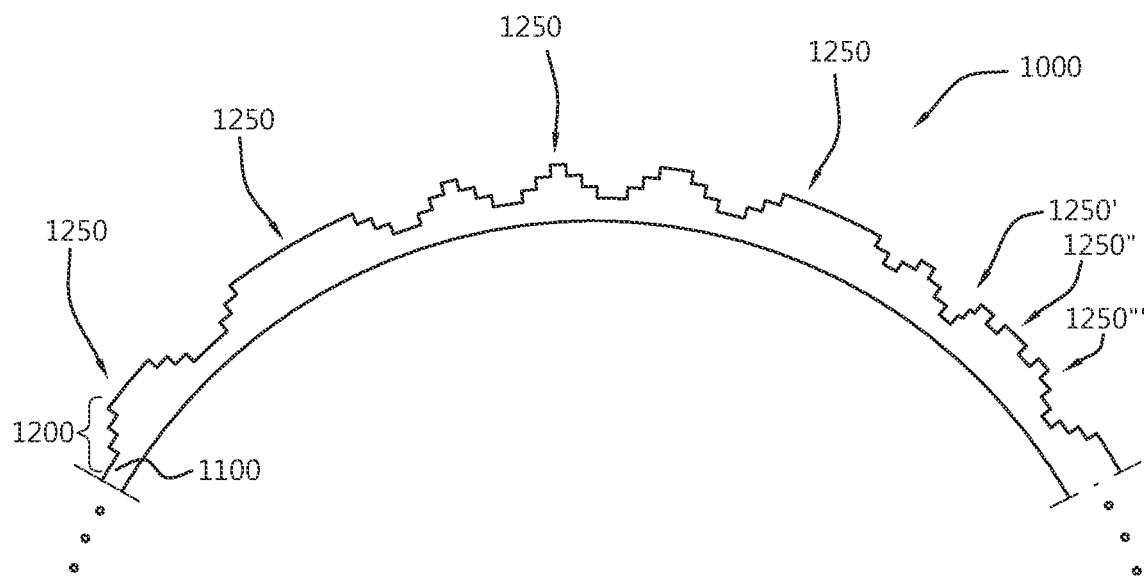
FIG. 6 is a schematic cross section of an exemplary embodiment of a generated relief carrier.

FIG. 6 is a sectional view of a relief carrier 1000 having a base layer 1100 and a relief layer 1200. The relief layer 1200 is formed as a stepped profile of solidified material. The stepped profile comprises a plurality of relief areas 1250, 1250', 1250", 1250'''. Preferably, the base layer 1100 is a cylindrical base layer. The cylindrical base layer 1100 may subscribe a full circumference such that a relief sleeve is formed, or it may extend over less than 360°. The base layer 1100 may correspond at least partially with the substrate, in embodiments where a substrate is used. In other embodiments where no substrate is used, the base layer 1100 may be a layer which is formed using the solidifiable material. The stepped profile may be provided over more than 10°, preferably over more than 90°, more preferably over more than 180°, even more preferably over more than 270°, and most preferably over substantially 360° of the outer surface of the relief carrier 1000.

Figure 7:
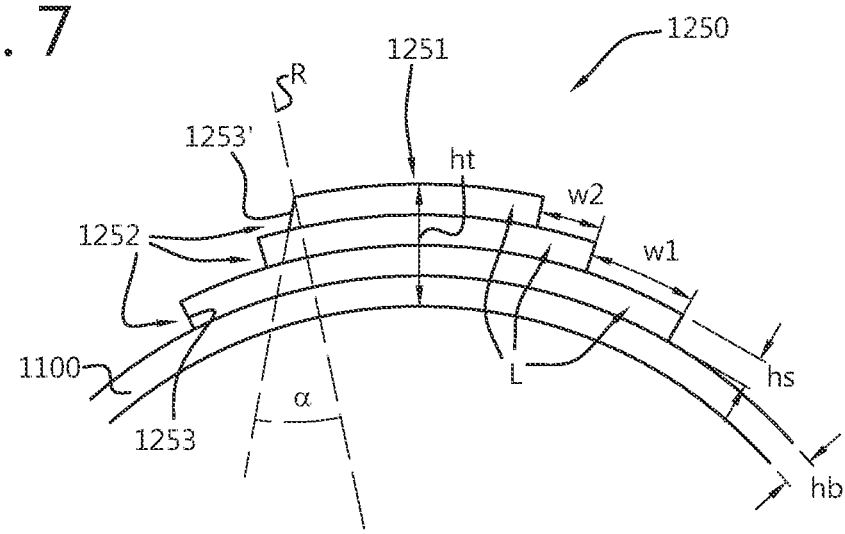
FIG. 7 is a schematic cross section in more detail of a relief area of the relief carrier of FIG. 6.

FIG. 7 shows in detail one relief area 1250. The relief area 1250 has an upper landing 1251 and at least one flight of steps 1252 between the base layer 1100 and the upper landing 1251. The upper landing 1251 may be a curved surface, e.g. a cylindrical surface which is concentric with the cylindrical base layer 1100. Each flight of steps 1252 may comprise a plurality of steps, preferably at least three steps, more preferably at least five steps. In the illustrated example, for reasons of simplicity, the flight of steps comprises only three steps 1252, but the skilled person understands that much more steps may be provided. The flight of steps 1252 may extend all the way from the base layer 1100 to the upper landing, as shown in FIG. 7. However, as shown in FIG. 6, when adjacent relief areas 1250', 1250", 1250''' are located close to one another, a flight of steps of a relief area 1250" may not extend all the way to the base layer 1100, and may be merged with a flight of steps an adjacent relief area 1250', 1250'''.

A step may correspond with a single layer L built during one pass of the irradiating means, but may also correspond with multiple layers L built during consecutive passes of the irradiating means. FIG. 7 further shows some dimensions of the steps 1252. Preferably, the height hs of a step 1252 of the stepped profile is smaller than 0.5 millimeter, more preferably smaller than 300 micrometer. The height hs may even be smaller than 200 micrometer or smaller than 100 micrometer. The base layer 1100 may have a thickness hb which is for example between 0.5 and 3 mm. The relief carrier 1000 may have a maximum thickness ht which is smaller than 10 mm, preferably smaller than 7 mm. The steps 1252 of the stepped profile are delimited by riser walls 1253, 1253'. Riser wall 1253' is oriented at an angle α of less than 20° from a radial direction R, preferably less than 10° from the radial direction R. Preferably a riser wall 1253 is oriented substantially radially. The width w1, w2 of a step 1252 may vary, e.g. depending on the desired "steepness" of the flight of steps. For example, when two adjacent relief areas 1250 have to be positioned close to one another, the width w2 of an upper step may be relatively small, whilst one or more lower steps may have a width w1 which is larger than w2.

Figure 8A:
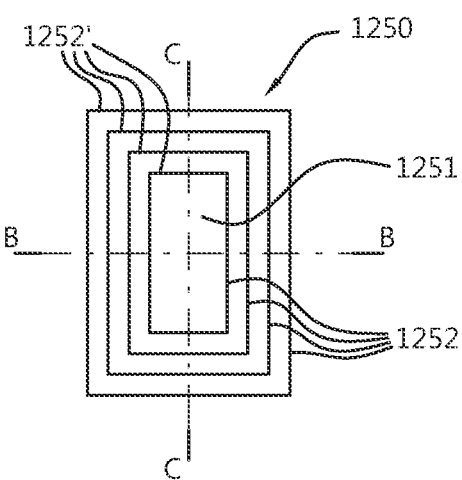
FIGS. 8A, 8B, 8C show respectively a top view, a section along line B-B in FIG. 8A, and a section along line C-C in FIG. 8A of an exemplary embodiment of a relief area.
Figure 8B:
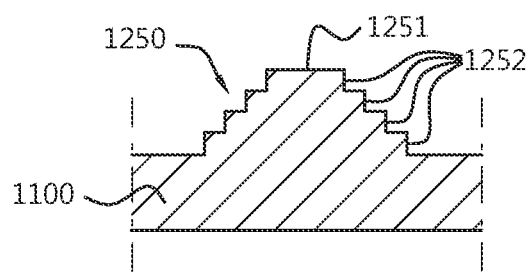
Figure 8C:
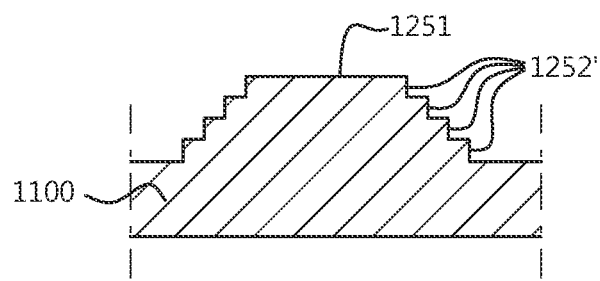

In a possible embodiment, the upper landing 1251 is substantially surrounded by the at least one flight of steps. In the embodiment of FIGS. 8A, 8B, 8C the upper landing 1251 has a substantially polygonal shape and there is provided a flight of steps 1252, 1252' at each edge of the polygonal upper landing 1251, see also the section along line B-B shown in FIG. 8B and the section along line C-C shown in FIG. 8C. The direction of line C-C may correspond with the axial direction A of the support structure. In the illustrated example the shape of the upper landing 1251 is rectangular, but the skilled person understands that the upper landing 1251 may have any shape, e.g. depending on the image that has to be printed.

Figure 9A:
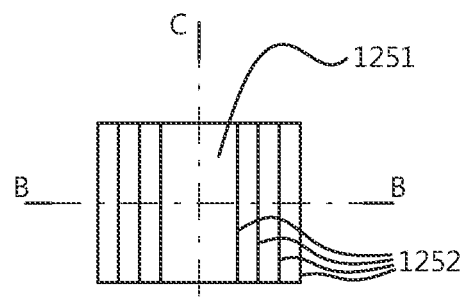
FIGS. 9A, 9B, 9C show respectively a top view, a section along line B-B in FIG. 9A, and a section along line C-C in FIG. 9A of an exemplary embodiment of a relief area.
Figure 9B:
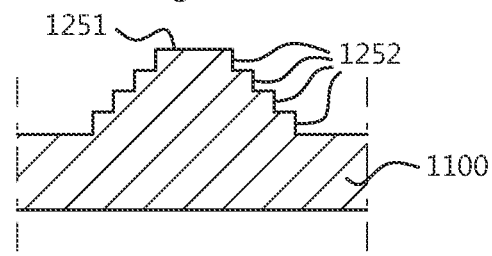
Figure 9C:
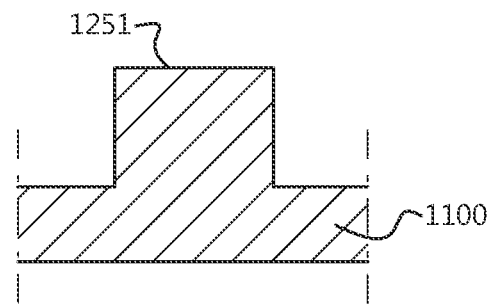

In another possible embodiment, the upper landing 1251 is not fully surrounded by the at least one flight of steps. In the embodiment of FIGS. 9A, 9B, 9C the upper landing 1251 has a substantially polygonal shape and there are provided two flights of steps 1252 at opposite sides of the polygonal upper landing 1251, see also the section along line B-B shown in FIG. 9B. The direction of line C-C may correspond with the axial direction A of the support structure. In the illustrated example the shape of the upper landing 1251 is rectangular, but the skilled person understands that the upper landing 1251 may have any shape, e.g. depending on the image that has to be printed.

Figure 10A:
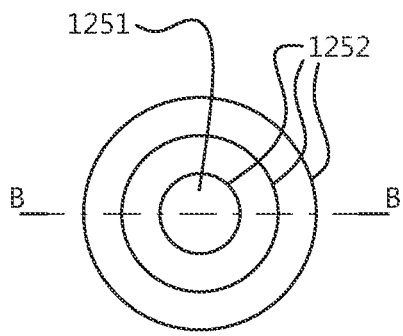
FIGS. 10A and 10B show respectively a top view and a section along line B-B in FIG. 10A of an exemplary embodiment of a relief area.
Figure 10B:
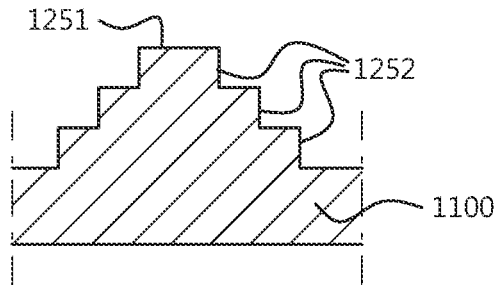

In yet another possible embodiment, the upper landing 1251 is circular or rounded. In the embodiment of FIGS. 10A and 10B the upper landing 1251 has a substantially circular shape and there is provided a circular flight of steps 1252 around the upper landing 1251, see also the section along line B-B shown in FIG. 10B. Of course, any other regular or irregular shape of upper landing and its surrounding steps is possible whereby in general, the contours of the different layers are similar to the shape of the landing but they may be different as well.

By application and solidification of the layers in a curved form, the surface layers of the relief carrier are not mechanically stressed as comparable relief structures of the prior art, which are manufactured in a planar configuration and bent for mounting on a cylinder.

Further, by providing the steps to the relief areas, the relief areas 1250 are given additional stability. This may be especially useful for relief areas 1250 with a small upper landing 1251. In more advanced embodiments, the stepped profile may be determined in function of the image to be printed, and the number and/or size and/or shape of the steps may be adjusted in function of the image to be printed. For example, for large relief areas, less steps may be provided, whilst for small relief area more steps may be provided.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The embodiments are also intended to cover computers programmed to perform said steps of the above-described methods.

The functions of the various elements shown in the figures, including any functional blocks labelled as "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared.

Whilst the principles of the invention have been set out above in connection with specific embodiments, it is to be understood that this description is merely made by way of example and not as a limitation of the scope of protection which is determined by the appended claims.

The invention claimed is:

1. An apparatus for generating a relief carrier using a solidifiable material, said apparatus comprising:
   a support structure configured for providing a substantially cylindrical support surface, wherein the support surface is formed by a substrate to be part of the relief carrier to be generated;
   a container for receiving the solidifiable material, said container having a wall arranged substantially parallel to an axis of the support structure, such that the support surface is at a determined distance of the wall, wherein the axis is the axis of the substantially cylindrical support surface;
   a moving means configured to move the support structure relative to the wall, such that subsequent areas of the support surface face the wall during the moving; said moving comprising at least a rotation around the axis, wherein the moving means is configured to move the support structure relative to the wall such that the axis of the support structure is moved parallel relative to the wall of the container while rotating the support structure around the axis; and
   an irradiating means configured to send irradiation, through said wall, in a predetermined area between the support surface and the wall to solidify the solidifiable material at the support surface; wherein the wall is configured to allow said irradiation to pass through the wall.

2. The apparatus according to claim 1, wherein the support structure is configured for receiving a substrate in the form of sleeve forming the support surface.

3. The apparatus according to claim 1, wherein the moving means is configured to allow the support surface to be provided with
   solidified material over substantially 360°; and/or wherein the support surface describes a full cylinder.

4. The apparatus according to claim 1, wherein the moving means is configured to translate the support structure and/or to translate the container; wherein the apparatus further comprises an irradiation movement means configured to move an irradiating area of the irradiating means with respect to the wall in synchronization with the support structure.

5. The apparatus according to claim 1, further comprising an adjustment means configured to change the distance between the wall and the support structure.

6. The apparatus according to claim 4, further comprising a controller configured to control the moving means, the irradiation movement means and the irradiating means such that subsequent adjacent longitudinal zones of the support surface are irradiated, said longitudinal zones extending parallel to the axis of the support structure.

7. The apparatus according to claim 5, further comprising a controller configured to control the moving means, an irradiation movement means configured to move an irradiating area of the irradiating means with respect to the wall in synchronization with the support structure and the irradiating means such that subsequent adjacent longitudinal zones of the support surface are irradiated, said longitudinal zones extending parallel to the axis of the support structure;
   wherein the controller is configured to control the moving means, the adjustment means and the irradiating means such that one or multiple layers of solidified material are formed on the support surface; and/or such that during one or more rotations of the support structure at least one structured layer of solidified material is formed.

8. The apparatus according to claim 5, further comprising a controller configured to control the moving means, an irradiation movement means configured to move an irradiating area of the irradiating means with respect to the wall in synchronization with the support structure and the irradiating means such that subsequent adjacent longitudinal zones of the support surface are irradiated, said longitudinal zones extending parallel to the axis of the support structure;
   wherein the controller is configured to control the moving means, the adjustment means and the irradiating means such that during one or more rotations of the support structure at least one full layer of solidified material is formed on the support surface to form a floor, and during one or more subsequent rotations at least one imaged layer of structured solidified material is formed on the floor.

9. The apparatus according to claim 1, wherein the wall is a bottom wall of the container; and wherein the wall is provided on a surface inside the container with an anti-stick coating configured to limit sticking to solidified material; wherein the wall is transparent to electromagnetic radiation and/or inhibitors.

10. The apparatus according to claim 1, wherein the irradiating means comprises one or more irradiating elements arranged in one or more lines parallel to the axis of the support structure; and wherein the irradiating means comprise a UV irradiating means.

11. The apparatus according to claim 1, wherein the predetermined area where the solidifiable material is solidified, is delimited by the support surface and the wall.

12. An apparatus for generating a relief carrier using a solidifiable material, said apparatus comprising:
   a support structure configured for providing a substantially cylindrical support surface, wherein the support surface is formed by a substrate to be part of the relief carrier to be generated;
   a container for receiving the solidifiable material, said container having a wall arranged substantially parallel to an axis of the support structure, such that the support surface is at a determined distance of the wall, wherein the axis is the axis of the substantially cylindrical support surface;
   a moving means configured to move the support structure relative to the wall, such that subsequent areas of the support surface face the wall during the moving; said moving comprising at least a rotation around the axis, wherein the moving means is configured to translate and rotate the support structure relative to the wall such that for each degree of rotation of the support structure the support structure is translated relative to the wall over a distance which is within 10% of a value calculated as x multiplied with the outer diameter of the support surface divided by 360 ($\pi*d/360$); and
   an irradiating means configured to send irradiation, through said wall, in a predetermined area between the support surface and the wall to solidify the solidifiable material at the support surface; wherein the wall is configured to allow said irradiation to pass through the wall.

13. An apparatus for generating a relief carrier using a solidifiable material, said apparatus comprising:
- a support structure configured for providing a substantially cylindrical support surface, wherein the support surface is formed by a substrate to be part of the relief carrier to be generated;
- a container for receiving the solidifiable material, said container having a wall arranged substantially parallel to an axis of the support structure, such that the support surface is at a determined distance of the wall, wherein the axis is the axis of the substantially cylindrical support surface;
- a moving means configured to move the support structure relative to the wall, such that subsequent areas of the support surface face the wall during the moving; said moving comprising at least a rotation around the axis, wherein the moving means is configured to translate the support structure relative to the wall in a forward direction from an initial position to an end position, while the support structure is being rotated, and next in a backward direction from the end position to the initial position; and
- an irradiating means configured to send irradiation, through said wall, in a predetermined area between the support surface and the wall to solidify the solidifiable material at the support surface; wherein the wall is configured to allow said irradiation to pass through the wall.

* * * * *

UNITED STATES PATENT AND TRADEMARK OFFICE
CERTIFICATE OF CORRECTION

| | | |
|---|---|---|
| PATENT NO. | : 12,353,135 B2 | Page 1 of 1 |
| APPLICATION NO. | : 17/413012 | |
| DATED | : July 8, 2025 | |
| INVENTOR(S) | : Wattyn et al. | |

It is certified that error appears in the above-identified patent and that said Letters Patent is hereby corrected as shown below:

In the Claims

Column 18, Line 63, Claim 12, delete "x" and insert --π-- after "as"

Signed and Sealed this
Thirtieth Day of September, 2025

John A. Squires
*Director of the United States Patent and Trademark Office*